(12) United States Patent
Sonoda

(10) Patent No.: US 6,591,233 B1
(45) Date of Patent: Jul. 8, 2003

(54) DEVICE FOR AND METHOD OF SIMULATION, METHOD OF SETTING MANUFACTURING PROCESS CONDITION, AND RECORDING MEDIUM

(75) Inventor: Kenichiro Sonoda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/358,809

(22) Filed: Jul. 22, 1999

(30) Foreign Application Priority Data

Mar. 12, 1999 (JP) ............................................. 11-066445

(51) Int. Cl.[7] .............................................. G06F 17/50
(52) U.S. Cl. ............................... 703/14; 703/4; 703/18; 716/4; 716/7
(58) Field of Search ....................... 703/1–28; 716/1–16

(56) References Cited

U.S. PATENT DOCUMENTS 5,754,826 A * 5/1998 Gamal et al. .................. 703/14
5,949,694 A * 9/1999 Amerasekera et al. ...... 257/360

FOREIGN PATENT DOCUMENTS

JP          7-153945          6/1995

OTHER PUBLICATIONS

Rodriguez et al, "ESD Circuit Synthesis and Analysis Using TCAD and SPICE", IEEE International Electron Devices Meeting, pp. 97–100 (Dec. 1998).*

Titus, "T&MW Visits a Failure–Analysis Lab", Test & Measurement World, vol. 18 No. 13, pp. 49–54 (Nov. 1998).*

Li et al, "Automated Extraction of Parasitic BJTs for CMOS I/O Circuits Under ESD Stress", 1997 IEEE International Integrated Reliability Workshop Final Report, pp. 103–109 (Oct. 1997).*

* cited by examiner

*Primary Examiner*—Samuel Broda, Esq.
(74) *Attorney, Agent, or Firm*—Oblon, Spivak, McClelland, Maier & Neustadt, P.C.

(57) ABSTRACT

A block dividing means (2) receives an original netlist (D1) defining a circuit to be simulated, selects a to-be-analyzed block specifying a device included in the circuit to be simulated based on input parameters provided from a parameter input means (1), divides the selected to-be-analyzed block into a plurality of to-be-analyzed sub-blocks, establishes an electric connection between the plurality of to-be-analyzed sub-blocks so as to provide a circuit configuration equivalent to the to-be-analyzed block, and finally outputs a modified netlist (D2) defining a new circuit to be simulated in which the to-be-analyzed block is replaced with the plurality of to-be-analyzed sub-blocks. A circuit simulation means (3) performs a circuit simulation on the new circuit to be simulated which is defined by the modified netlist (D2). A device for and method of simulation provides a simulation result which reflects the shape of the device in a short period of calculation time.

9 Claims, 10 Drawing Sheets

DEVICE FOR AND METHOD OF SIMULATION, METHOD OF SETTING MANUFACTURING PROCESS CONDITION, AND RECORDING MEDIUM

BACKGROUND OF THE INVENTION

1. Field of the Invention

The present invention relates to a device for and method of simulation and, more particularly, to a device for and method of simulating an electrostatic discharge (ESD) to a semiconductor integrated circuit.

2. Description of the Background Art

An ESD applied to a semiconductor integrated circuit can impair the function of the integrated circuit or destroy the integrated circuit itself. Thus, a highly ESD-resistant device structure or circuit configuration is desired. However, it becomes more difficult to hold desired ESD resistance as semiconductor devices are reduced in size.

An ESD test which is carried out on packaged final products leads to a tendency toward an increase in time period between modifying a device structure or circuit configuration and obtaining a test result, and hence becomes a significant factor that determines a product development period. Therefore, it has been desired to use simulation to predict a modification in highly ESD-resistant device structure or circuit configuration with high precision.

With an ESD applied to a semiconductor device, the semiconductor device receives high voltage to reveal a pronounced shape effect which would present no problem at normal operating voltage. For example, if the gate widths of MOSFETs are not uniform but differ according to the position because of the manufacturing process, current is liable to concentrate on a position where the gate width is smaller to cause device breakdown. An ESD simulation which takes such a device shape effect into consideration has required the use of a three-dimensional device simulation. The device simulation uses a computer to determine device characteristics from the behavior of carriers in the device, based on the physical shape and impurity distribution of the device.

However, the device simulation which divides a semiconductor device structure to be analyzed into small regions called meshes and calculates the potential and carrier concentration at a node which represents each of the meshes is required to perform calculations at as numerous as not less than hundreds of thousands of nodes. Therefore, the method using the three-dimensional device simulation is disadvantageous in requiring too much time for calculations.

SUMMARY OF THE INVENTION

According to a first aspect of the present invention, a simulation device comprises: to-be-analyzed block dividing means receiving a netlist defining a circuit to be simulated and for dividing a predetermined to-be-analyzed block specifying a device included in the circuit to be simulated into a plurality of to-be-analyzed sub-blocks arranged in a predetermined direction, with equivalence with the predetermined to-be-analyzed block maintained, to output a modified netlist defining a new circuit to be simulated in which the predetermined to-be-analyzed block is replaced with the plurality of to-be-analyzed sub-blocks; and circuit simulation means for performing a circuit simulation on the new circuit to be simulated which is defined by the modified netlist, wherein the to-be-analyzed block dividing means is capable of individually setting circuit simulation characteristic values, respectively, of the plurality of to-be-analyzed sub-blocks.

Preferably, according to a second aspect of the present invention, the simulation device of the first aspect further comprises parameter input means for inputting an input parameter to the to-be-analyzed block dividing means, the input parameter containing information which determines the circuit simulation characteristic values, respectively, of the plurality of to-be-analyzed sub-blocks, wherein the to-be-analyzed block dividing means individually sets the circuit simulation characteristic values, respectively, of the plurality of to-be-analyzed sub-blocks, based on the input parameter.

Preferably, according to a third aspect of the present invention, in the simulation device of the first or second aspect, the predetermined to-be-analyzed block includes a MOS transistor which takes a resistance element into consideration, and the predetermined direction includes the direction of the gate width of the MOS transistor.

Preferably, according to a fourth aspect of the present invention, in the simulation device of the third aspect, the to-be-analyzed block dividing means establishes an electric connection between adjacent ones of the plurality of to-be-analyzed sub-blocks through a connecting resistor.

According to a fifth aspect of the present invention, a simulation device comprises: to-be-analyzed region dividing means receiving computational structure data defining a circuit structure to be simulated which is simulatable in a three-dimensional device simulation and for dividing a predetermined to-be-analyzed region having a three-dimensional structure and specifying a device included in the circuit structure to be simulated into a plurality of to-be-analyzed sub-regions arranged in a predetermined direction and each simulatable in a two-dimensional device simulation, with equivalence with the predetermined to-be-analyzed region maintained, to output modified computational structure data defining a new circuit structure to be simulated in which the predetermined to-be-analyzed region is replaced with the plurality of to-be-analyzed sub-regions; and device simulation means for performing a two-dimensional device simulation on the new circuit structure to be simulated which is defined by the modified computational structure data.

Preferably, according to a sixth aspect of the present invention, the simulation device of the fifth aspect further comprises parameter input means for inputting an input parameter to the to-be-analyzed region dividing means, the input parameter containing information which determines device simulation characteristic values, respectively, of the plurality of to-be-analyzed sub-regions, wherein the to-be-analyzed region dividing means individually sets the device simulation characteristic values, respectively, of the plurality of to-be-analyzed sub-regions, based on the input parameter.

Preferably, according to a seventh aspect of the present invention, in the simulation device of the fifth or sixth aspect, the predetermined to-be-analyzed region includes a MOS transistor which takes a resistance element into consideration, and the predetermined direction includes the direction of the gate width of the MOS transistor.

Preferably, according to an eighth aspect of the present invention, in the simulation device of the seventh aspect, the to-be-analyzed region dividing means establishes an electric connection between adjacent ones of the plurality of to-be-analyzed sub-regions through a connecting resistor.

According to a ninth aspect of the present invention, a method of simulation comprises the steps of: (a) reading a netlist defining a circuit to be simulated; (b) selecting a predetermined to-be-analyzed block to be divided which specifies a device out of the circuit to be simulated; (c) dividing the predetermined to-be-analyzed block into a plurality of to-be-analyzed sub-blocks arranged in a predetermined direction and individually setting circuit simulation characteristic values, respectively, of the plurality of to-be-analyzed sub-blocks; (d) establishing an electric connection between the plurality of to-be-analyzed sub-blocks so as to maintain equivalence with the predetermined to-be-analyzed block, and thereafter outputting a modified netlist defining a new circuit to be simulated in which the predetermined to-be-analyzed block is replaced with the plurality of to-be-analyzed sub-blocks; and (e) performing a circuit simulation on the new circuit to be simulated which is defined by the modified netlist.

According to a tenth aspect of the present invention, a method of simulation comprises the steps of: (a) reading computational structure data defining a circuit structure to be simulated which is simulatable in a three-dimensional device simulation; (b) selecting a predetermined to-be-analyzed region to be divided, the predetermined to-be-analyzed region having a three-dimensional structure and specifying a device included in the circuit structure to be simulated; (c) dividing the predetermined to-be-analyzed region into a plurality of to-be-analyzed sub-regions arranged in a predetermined direction and each simulatable in a two-dimensional device simulation; (d) establishing an electric connection between the plurality of to-be-analyzed sub-regions so as to maintain equivalence with the predetermined to-be-analyzed region, and thereafter outputting modified computational structure data defining a new circuit structure to be simulated in which the predetermined to-be-analyzed region is replaced with the plurality of to-be-analyzed sub-regions; and (e) performing a two-dimensional device simulation on the new circuit structure to be simulated which is defined by the modified computational structure data.

According to an eleventh aspect of the present invention, a method of setting a process condition using the method of simulation according to the ninth aspect comprises the steps of: (a) performing a method of simulation as recited in the ninth aspect using as the circuit to be simulated a predetermined semiconductor integrated circuit manufactured through a manufacturing process with a temporary manufacturing process condition established therein; (b) judging whether or not the circuit to be simulated satisfies a predetermined standard, based on a result of the simulation performed in the step (a); (c) modifying the temporary manufacturing process condition to execute the steps (a) and (b) again when it is judged in the step (b) that the circuit to be simulated does not satisfy the predetermined standard; and (d) setting an actual manufacturing process condition for use in actual manufacture of the predetermined semiconductor integrated circuit by substituting the temporary manufacturing process condition for the actual manufacturing process condition when it is judged in the step (b) that the circuit to be simulated satisfies the predetermined standard.

According to a twelfth aspect of the present invention, a method of setting a process condition using the method of simulation according to the tenth aspect comprises the steps of: (a) performing a method of simulation as recited in the tenth aspect using as the circuit structure to be simulated a predetermined semiconductor integrated circuit manufactured through a manufacturing process with a temporary manufacturing process condition established therein; (b) judging whether or not the circuit structure to be simulated satisfies a predetermined standard, based on a result of the simulation performed in the step (a); (c) modifying the temporary manufacturing process condition to execute the steps (a) and (b) again when it is judged in the step (b) that the circuit structure to be simulated does not satisfy the predetermined standard; and (d) setting an actual manufacturing process condition for use in actual manufacture of the predetermined semiconductor integrated circuit by substituting the temporary manufacturing process condition for the actual manufacturing process condition when it is judged in the step (b) that the circuit structure to be simulated satisfies the predetermined standard.

A thirteenth aspect of the present invention is intended for a computer readable recording medium on the method of simulation according to the ninth aspect. The recording medium has stored thereon a program for performing a method of simulation as recited in the ninth aspect.

A fourteenth aspect of the present invention is intended for a computer readable recording medium on the method of simulation according to the tenth aspect. The recording medium has stored thereon a program for performing a method of simulation as recited in the tenth aspect.

As described hereinabove, the to-be-analyzed block dividing means of the simulation device according to the first aspect of the present invention divides the predetermined to-be-analyzed block into the plurality of to-be-analyzed sub-blocks arranged in the predetermined direction, with equivalence with the predetermined to-be-analyzed block maintained, to output the modified netlist defining the new circuit to be simulated in which the predetermined to-be-analyzed block is replaced with the plurality of to-be-analyzed sub-blocks. Further, the to-be-analyzed block dividing means is capable of individually setting the circuit simulation characteristic values, respectively, of the plurality of to-be-analyzed sub-blocks.

The circuit simulation may be performed on the circuit to be simulated which shows a change in device shape in the predetermined direction by providing the different circuit simulation characteristic values, respectively, of the plurality of to-be-analyzed sub-blocks. This provides a simulation result that precisely reflects the device shape change in the predetermined direction, which has not been taken into consideration in a circuit simulation of a single to-be-analyzed block, in a short period of calculation time.

The to-be-analyzed block dividing means of the simulation device according to the second aspect of the present invention sets the circuit simulation characteristic values, respectively, of the plurality of to-be-analyzed sub-blocks, based on the input parameter provided from the parameter input means. Therefore, the circuit simulation characteristic values of the respective to-be-analyzed sub-blocks may be externally set at desired values using the parameter input means.

In the simulation device according to the third aspect of the present invention, the predetermined to-be-analyzed block includes the MOS transistor which takes the resistance element into consideration, and the predetermined direction includes the direction of the gate width of the MOS transistor. Therefore, the simulation device can perform the circuit simulation which precisely reflects the device shape change in the direction of the gate width of the MOS transistor.

The to-be-analyzed block dividing means of the simulation device according to the fourth aspect of the present invention establishes the electric connection between adjacent ones of the to-be-analyzed sub-blocks through the connecting resistor, thereby to taken into consideration current flowing in the direction of the gate width as a potential difference across the connecting resistor.

The to-be-analyzed region dividing means of the simulation device according to the fifth aspect of the present invention divides the predetermined to-be-analyzed region into the plurality of to-be-analyzed sub-regions arranged in the predetermined direction and each simulatable in the two-dimensional device simulation, with the equivalence with the predetermined to-be-analyzed region maintained, to output the modified computational structure data defining the new circuit structure to be simulated in which the predetermined to-be-analyzed region is replaced with the plurality of to-be-analyzed sub-regions.

The two-dimensional device simulation which taken into consideration the device shape change in the predetermined direction may be performed by providing the different device simulation characteristic values, respectively, of the plurality of to-be-analyzed sub-regions.

Additionally, the two-dimensional device simulation requires shorter calculation time than the three-dimensional device simulation, to provide the simulation result in a relatively short period of time.

The to-be-analyzed region dividing means of the simulation device according to the sixth aspect of the present invention sets the device simulation characteristic values, respectively, of the plurality of to-be-analyzed sub-regions, based on the input parameter provided from the parameter input means. Therefor e, the device simulation characteristic values of the respective to-be-analyzed sub-regions may be externally set at desired values using the parameter input means.

In the simulation device according to the seventh aspect of the present invention, the predetermined to-be-analyzed region includes the MOS transistor which takes the resistance element into consideration, and the predetermined direction includes the direction of the gate width of the MOS transistor. Therefore, the simulation device can perform the two-dimensional device simulation which precisely reflects the device shape change in the direct ion of the gate width of the MOS transistor.

The to-be-analyzed region dividing means of the simulation device according to the eighth aspect of the present invention establishes the electric connection between adjacent ones of the to-be-analyzed sub-regions through the connecting resistor, thereby to taken into consideration the current flowing in the direction of the gate width as a potential difference across the connecting resistor.

In the step (c) of the method of simulation according to the ninth aspect of the present invention, the predetermined to-be-analyzed block is divided into the plurality of to-be-analyzed sub-blocks arranged in the predetermined direction, and the circuit simulation characteristic values, respectively, of the plurality of to-be-analyzed sub-blocks are individually set. In the step (d), the electric connection is established between the plurality of to-be-analyzed sub-blocks so as to maintain the equivalence with the predetermined to-be-analyzed block, and the modified netlist is outputted which defines the new circuit to be simulated in which the predetermined to-be-analyzed block is replaced with the plurality of to-be-analyzed sub-blocks.

As a result, the circuit simulation may be performed in the step (e) upon the circuit to be simulated which shows a change in device shape in the predetermined direction by providing the different circuit simulation characteristic values, respectively, of the plurality of to-be-analyzed sub-blocks. This provides a simulation result that precisely reflects the device shape change in the predetermined direction, which has not been taken into consideration in a circuit simulation of a single to-be-analyzed block, in a short period of calculation time.

In the step (c) of the method of simulation according to the tenth aspect of the present invention, the predetermined to-be-analyzed region is divided into the plurality of to-be-analyzed sub-regions arranged in the predetermined direction and each simulatable in the two-dimensional device simulation. In the step (d), the electric connection is established between the plurality of to-be-analyzed sub-regions so as to maintain the equivalence with the predetermined to-be-analyzed region, and the modified computational structure data is outputted which defines the new circuit structure to be simulated in which the predetermined to-be-analyzed region is replaced with the plurality of to-be-analyzed sub-regions.

Therefore, the two-dimensional device simulation which precisely reflects the device shape change in the predetermined direction may be performed in the step (e) by providing the different device simulation characteristic values, respectively, of the plurality of to-be-analyzed sub-regions.

Additionally, the two-dimensional device simulation requires shorter calculation time than the three-dimensional device simulation, to provide the simulation result in a relatively short period of time.

In the method of setting a manufacturing process condition according to the eleventh aspect of the present invention, the actual manufacturing process condition is set by substituting the temporary manufacturing process condition for the actual manufacturing process condition when it is judged that the predetermined standard is satisfied, based on the result of the circuit simulation performed according to the simulation method of the ninth aspect. Hence, the actual manufacture of the predetermined semiconductor integrated circuit through the predetermined manufacturing process under the actual manufacturing process condition provides a semiconductor integrated circuit which reliably satisfies the predetermined standard.

In the method of setting a manufacturing process condition according to the twelfth aspect of the present invention, the actual manufacturing process condition is set by substituting the temporary manufacturing process condition for the actual manufacturing process condition when it is judged that the predetermined standard is satisfied, based on the result of the two-dimensional device simulation performed according to the simulation method of the tenth aspect. Hence, the actual manufacture of the predetermined semiconductor integrated circuit through the predetermined manufacturing process under the actual manufacturing process condition provides a semiconductor integrated circuit which reliably satisfies the predetermined standard.

The recording medium according to the thirteenth aspect of the present invention has stored thereon the program for executing the simulation method of the ninth aspect. The execution of the program by the computer provides a simulation result that precisely reflects a device shape change, which has not been taken into consideration in a circuit simulation of a single to-be-analyzed block, in a short period of calculation time.

The recording medium according to the fourteenth aspect of the present invention has stored thereon the program for executing the simulation method of the tenth aspect. The program may be executed by the computer to perform the two-dimensional device simulation that precisely reflects the device shape change.

It is therefore an object of the present invention to provide a device for and method of simulation capable of providing a simulation result which reflects the shape of a device in a short period of calculation time.

These and other objects, features, aspects and advantages of the present invention will become more apparent from the following detailed description of the present invention when taken in conjunction with the accompanying drawings.

DESCRIPTION OF THE PREFERRED EMBODIMENTS

<First Preferred Embodiment>

Figure 1:
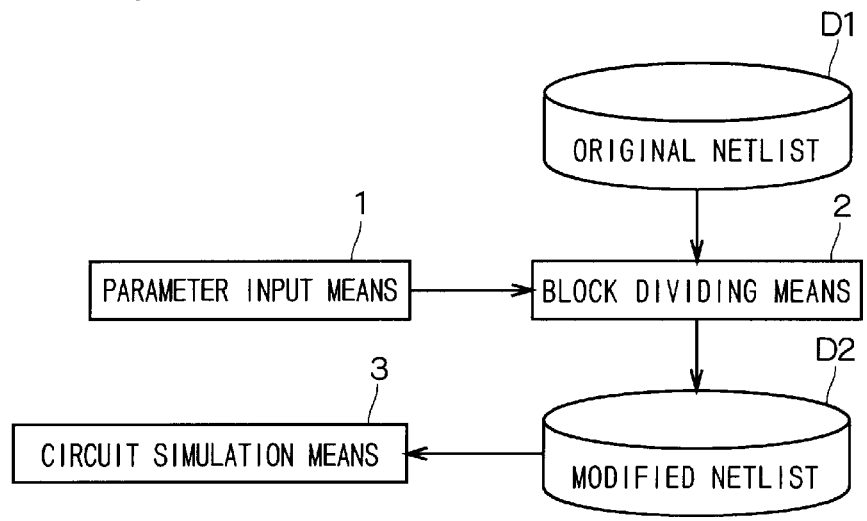
FIG. 1 is a block diagram of an ESD simulation device according to a first preferred embodiment of the present invention.

FIG. 1 is a block diagram of an ESD simulation device according to a first preferred embodiment of the present invention.

As shown in FIG. 1, a parameter input means 1 provides to a block dividing means 2 input parameters which contain information including a to-be-analyzed block to be divided into a plurality of to-be-analyzed sub-blocks, the number of to-be-analyzed sub-blocks, and the standard deviation of variations in electrical characteristic values between the plurality of to-be-analyzed sub-blocks.

The block dividing means 2 receives an original netlist D1 which defines a circuit to be simulated, selects a to-be-analyzed block which specifies a device in the circuit to be simulated based on the input parameters provided from the parameter input means 1, divides the selected to-be-analyzed block into a plurality of to-be-analyzed sub-blocks, establishing an electric connection between the plurality of to-be-analyzed sub-blocks so as to provide a circuit configuration equivalent to the to-be-analyzed block, and finally outputs a modified netlist D2 which defines a new circuit to be simulated in which the to-be-analyzed block is replaced with the plurality of to-be-analyzed sub-blocks. The original netlist D1 is provided from a netlist providing means not shown.

A circuit simulation means 3 receives the modified netlist D2, performs a circuit simulation on the circuit defined by the modified netlist D2, and outputs a circuit simulation result. The parameter input means 1, the block dividing means 2 and the circuit simulation means 3 are controlled by a calculation control means not shown.

Figure 2:
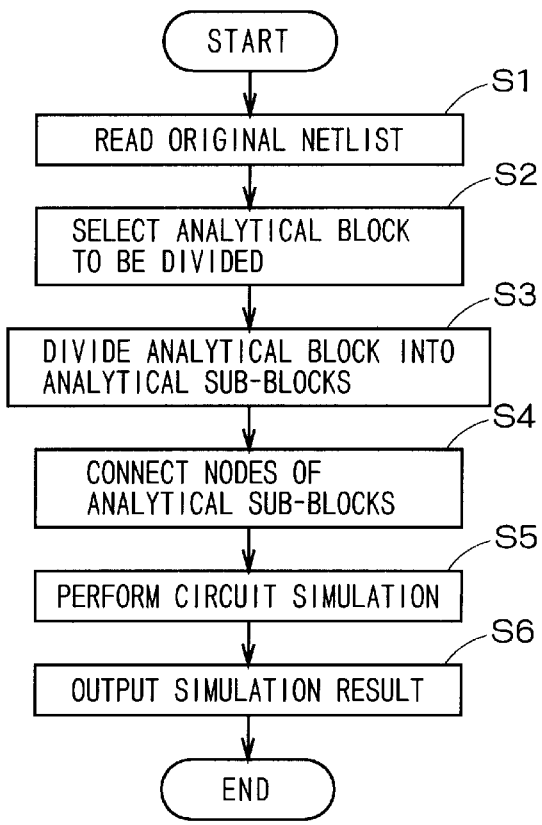
FIG. 2 is a flowchart showing an ESD simulation method according to the first preferred embodiment.
Figure 3:
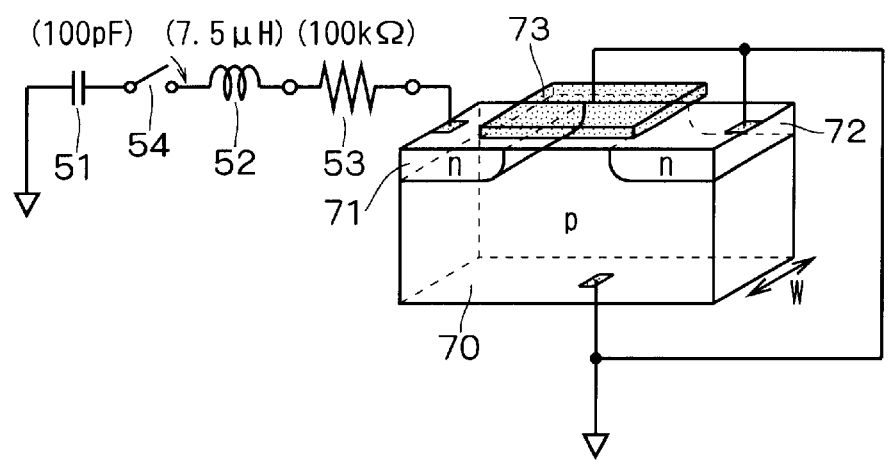
FIG. 3 is a circuit diagram of a human body model.

FIG. 2 is a flowchart showing an ESD simulation method to be practiced by the ESD simulation device according to the first preferred embodiment. FIG. 3 illustrates a circuit to be simulated including a MOSFET to which an ESD from a human body model (HBM) is applied.

Referring to FIG. 3, a capacitor 51 (100 pF) is connected in series with an inductor 52 (7.5 $\mu$H) and a resistor 53 (1.5 k$\Omega$) through a switch 54. An ESD from the human body model is applied to the MOSFET when the switch is changed from the off state to the on state.

The MOSFET includes a substrate 70, a drain region 71 and a source region 72 which are selectively formed in upper part of the substrate 70, and a gate electrode 73 (having a gate width W) formed on part of the substrate 70 which lies between the drain region 71 and the source region 72. The drain region 71 is connected to one end of the resistor 53, whereas the source region 72, the gate electrode 73 and the substrate 70 are connected to a ground level.

The flow of FIG. 2 will be described using the MOSFET shown in FIG. 3 as an example.

In Step S1, the block dividing means 2 reads the original netlist D1 which defines a conventional circuit for circuit simulation. The original netlist D1 is the data which defines the circuit to be simulated shown in FIG. 4.

Figure 4:
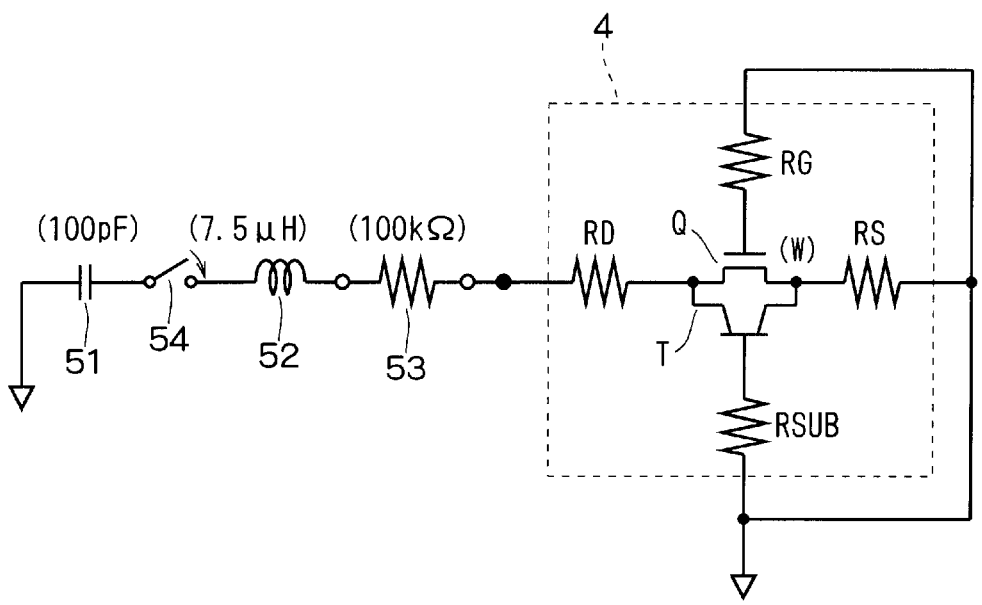
FIG. 4 is a circuit diagram showing a circuit configuration defined by an original netlist according to the first preferred embodiment.

With reference to FIG. 4, a MOS transistor (MOSFET) Q having the gate width W includes the drain region 71 having a drain resistor RD, the source region 72 having a source resistor RS, the gate electrode 73 having a gate resistor RG, and the substrate 70 having a substrate resistor RSUB. The drain region 71, the substrate 70 and the source region 72 constitute a bipolar transistor T.

Referring again to FIG. 2, in Step S2, the block dividing means 2 selects a to-be-analyzed block (or to-be-analyzed blocks) to be divided from the circuit to be simulated which is defined by the original netlist D1, based on the input parameters provided from the parameter input means 1. In the circuit example of FIG. 4, a structure including the drain resistor RD, the source resistor RS, the gate resistor RG, the substrate resistor RSUB, the MOS transistor Q and the bipolar transistor T corresponds to a to-be-analyzed block 4 to be divided.

In Step S3, the block dividing means 2 divides the to-be-analyzed block 4 into a plurality of to-be-analyzed sub-blocks arranged in a predetermined direction, based on the input parameters provided from the parameter input means 1.

For instance, when the to-be-analyzed block 4 shown in FIG. 4 is divided into N to-be-analyzed sub-blocks arranged in the direction of the gate width of the MOS transistor Q, each of the drain resistor RD, the source resistor RS, the gate resistor RG, the substrate resistor RSUB, the MOS transistor Q and the bipolar transistor T in the to-be-analyzed block 4 is divided into N components arranged in a gate width direction 21 of the MOS transistor Q. This provides N MOS transistors Q1 to Qn arranged in the gate width direction 21, N bipolar transistors T1 to Tn arranged similarly, N drain resistors RD1 to RDn arranged similarly, N source resistors RS1 to RSn arranged similarly, N gate resistors RG1 to RGn arranged similarly, and N substrate resistors RSUB1 to RSUBn arranged similarly.

Thus, the components Qi, Ti, RDi, RSi, RGi and RSUBi (i=1 to n) constitute one to-be-analyzed sub-block (an i-th to-be-analyzed sub-block).

In Step S3, after dividing the to-be-analyzed block 4 into the plurality of to-be-analyzed sub-blocks, the block dividing means 2 individually sets electrical characteristic values for circuit simulation of the respective to-be-analyzed sub-blocks, based on the input parameters provided from the parameter input means 1. The electrical characteristic values for circuit simulation include the resistances of the resistors RDi, RSi, RGi and RSUBi, the channel length of the MOS transistor Qi, and the saturation current of the bipolar transistor Ti.

In Step S4, for maintenance of circuit equivalence with the to-be-analyzed block and consideration of the current flowing in the direction of the gate width, the block dividing means 2 establishes connections between the nodes of the respective resistors of adjacent ones of the plurality of to-be-analyzed sub-blocks through node connecting resistors, and thereafter outputs the modified netlist D2 which defines the new circuit to be simulated in which the to-be-analyzed block is replaced with the plurality of to-be-analyzed sub-blocks to the circuit simulation means 3.

The node connecting resistors are provided for consideration of a voltage drop developed when current flows in the direction of the gate width of the device, and improves the precision of computations as an actual physical phenomenon. The value of the node connecting resistors may be calculated from the sheet resistance of a corresponding region or approximated to a zero resistance (in which case only the electric connections are made without the node connecting resistors). Consideration for the current flowing in the direction of the gate width will be described in detail later in a second preferred embodiment.

Figure 5:
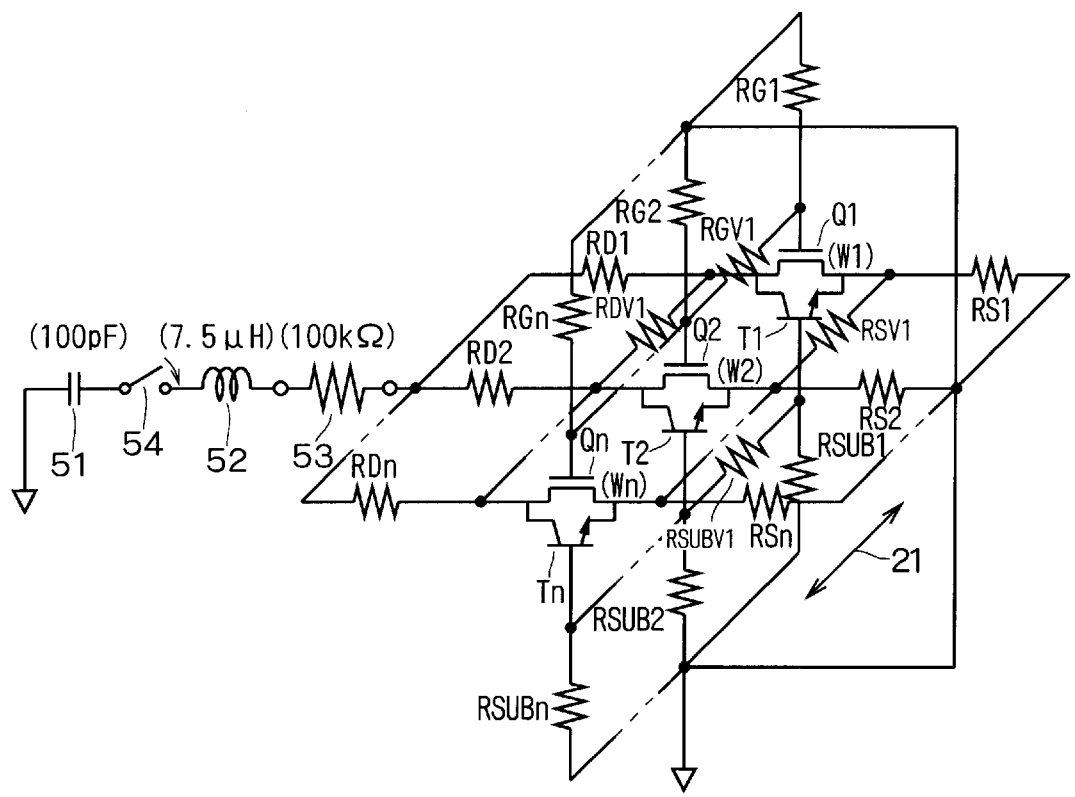
FIG. 5 is a circuit diagram showing a circuit configuration defined by a modified netlist according to the first preferred embodiment.

In the instance shown in FIG. 5, a node connecting resistor RDVj connects the MOS-transistor-side nodes of adjacent ones RDj and RD(j+1) (j=1 to (n−1)) of the drain resistors RD1 to RDn, and a node connecting resistor RSVj connects the MOS-transistorside nodes of adjacent ones RSj and RS(j+1) of the source resistors RS1 to RSn.

Similarly, a node connecting resistor RGVj connects the MOS-transistor-side nodes of adjacent ones RGj and RG(j+1) of the gate resistors RG1 to RGn, and a node connecting resistor RSUBVj connects the bipolar-transistor-side nodes of adjacent ones RSUBj and RSUB(j+1) of the substrate resistors RSUB1 to RSUBn. The netlist which defines the circuit to be simulated shown in FIG. 5 is used as the modified netlist D2.

Referring again to FIG. 2, in Step S5, the circuit simulation means 3 receives the modified netlist D2 and performs a circuit simulation on the circuit to be simulated which is defined by the modified netlist D2. In Step S6, the circuit simulation means 3 outputs a circuit simulation result and terminates the ESD simulation.

Figure 6:
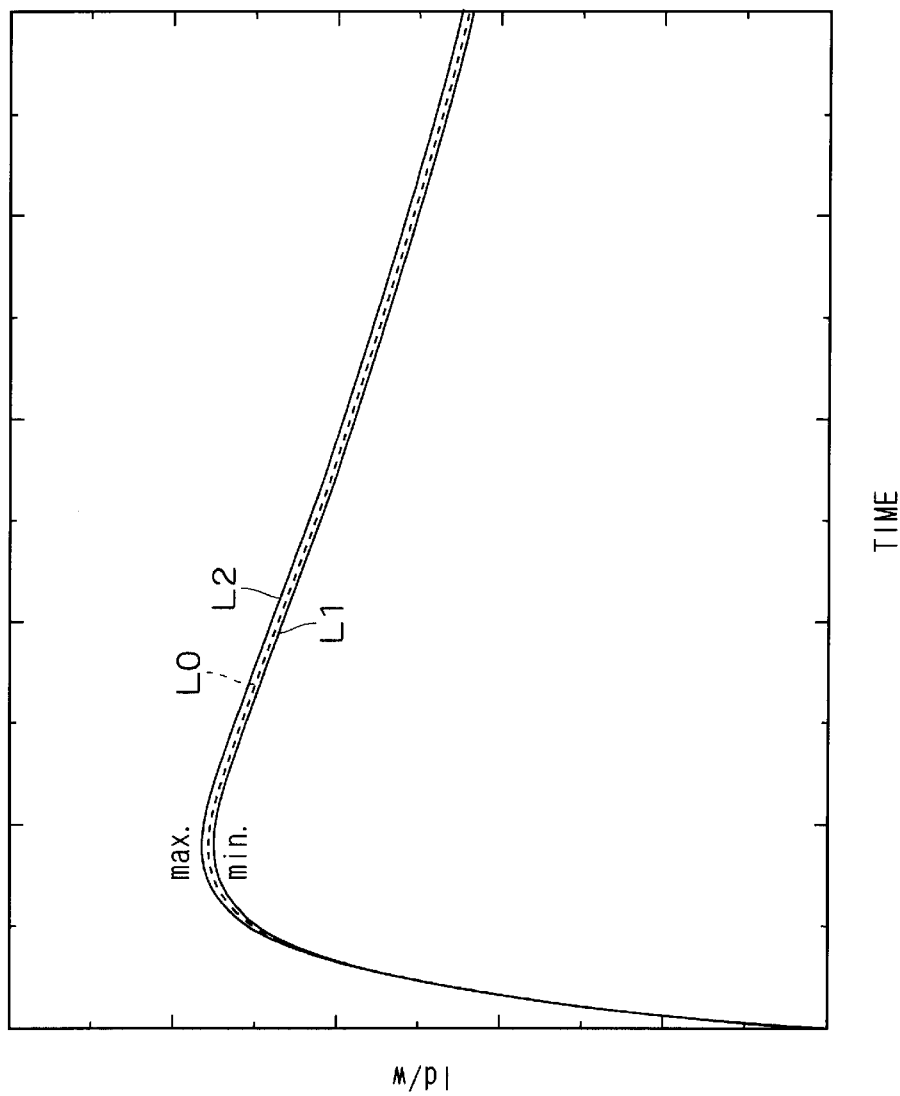
FIG. 6 is a graph showing simulation results according to the first preferred embodiment.

FIG. 6 is a graph showing a simulation result when the ESD simulation of the first preferred embodiment is performed on the MOSFET having the gate width W of 160 μm where N=5 (N is the number of to-be-analyzed sub-blocks into which the to-be-analyzed block is divided). This simulation result shows changes over time in drain current Id/w per unit gate width. The broken curves L0 of FIG. 6 represents the simulation result based on the original netlist D1, and the solid curves L1 and L2 represent minimum and maximum values of the simulation result, respectively, with a variation of ±0.8% in resistance of the source resistors RS1 to RS5 and the drain resistors RD1 to RD5.

As shown in FIG. 6, the circuit simulation of the first preferred embodiment based on the modified netlist D2 precisely detects a drain current variation which has not been obtained by the circuit simulation based on the original netlist D1 as a difference between the solid curves L1 and L2. Assuming that the broken curve L0 denotes the average value of the drain current, the minimum and maximum values of the drain current deviate by −0.7% and +0.9%, respectively, from the average value.

Additionally, the time required to perform the circuit simulation based on the modified netlist D2 to obtain the simulation result of FIG. 6 is not greater than ten times the time required to perform the circuit simulation based on the original netlist D1, and is much shorter than the time required to perform a device simulation.

Furthermore, the block dividing means 2 of the simulation device according to the first preferred embodiment sets the electrical characteristic values of the respective to-be-analyzed sub-blocks based on the input parameters provided from the parameter input means 1. Therefore, the electrical characteristic values of the respective to-be-analyzed sub-blocks may be externally set at desired values by using the parameter input means 1.

<Second Preferred Embodiment>

Figure 7:
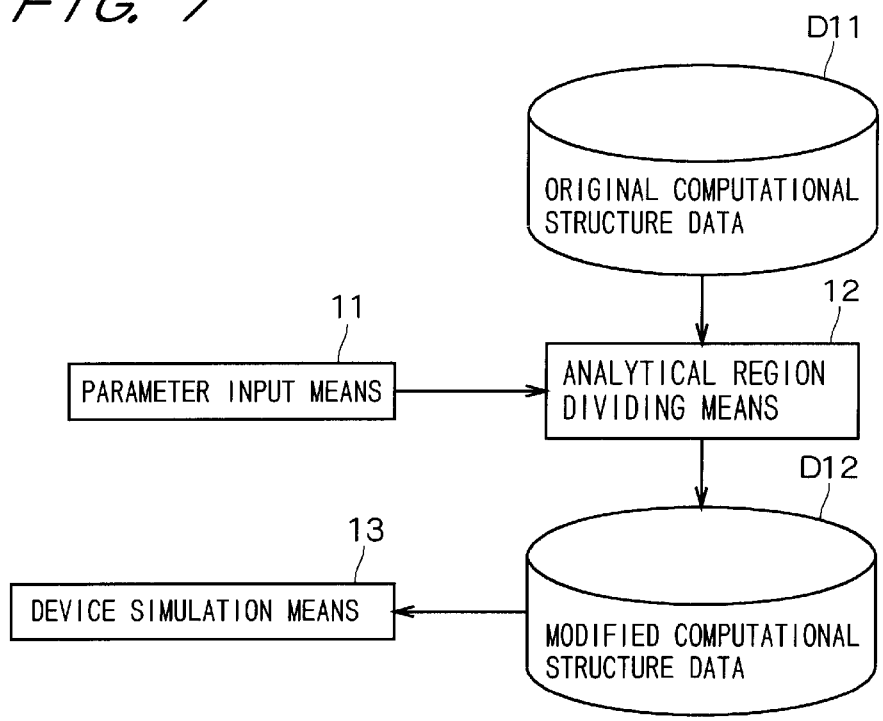
FIG. 7 is a block diagram of the ESD simulation device according to a second preferred embodiment of the present invention.

FIG. 7 is a block diagram of the ESD simulation device according to a second preferred embodiment of the present invention.

As shown in FIG. 7, a parameter input means 11 provides to a to-be-analyzed region dividing means 12 input parameters including a three-dimensional to-be-analyzed region to be divided into a plurality of to-be-analyzed sub-regions, the number of to-be-analyzed sub-regions, and the standard deviation of variations in shape characteristic values between the plurality of to-be-analyzed sub-regions.

The to-be-analyzed region dividing means 12 receives original computational structure data D11 which defines a circuit structure to be simulated, selects a three-dimensional to-be-analyzed region which specifies a device in the circuit structure to be simulated based on the input parameters provided from the parameter input means 11, divides the selected to-be-analyzed region into a plurality of two-dimensional to-be-analyzed sub-regions, establishing an electric connection between the plurality of to-be-analyzed sub-regions so as to provide a circuit configuration equivalent to the to-be-analyzed region, and finally outputs modified computational structure data D12 which defines a new circuit structure to be simulated in which the to-be-analyzed region is replaced with the plurality of to-be-analyzed sub-regions. The original computational structure data D11 is provided from an original computational structure data providing means not shown.

A device simulation means 13 receives the modified computational structure data D12, performs a two-dimensional device simulation on the circuit structure to be simulated which is defined by the modified computational structure data D12, and outputs a device simulation result. The parameter input means 11, the to-be-analyzed region dividing means 12 and the device simulation means 13 are controlled by a calculation control means not shown.

Figure 8:
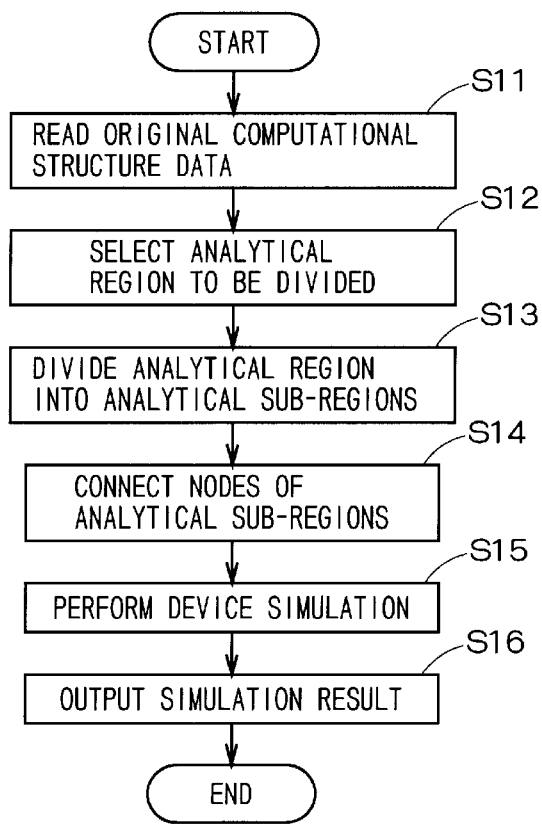
FIG. 8 is a flowchart showing the ESD simulation method according to the second preferred embodiment.

FIG. 8 is a flowchart showing an ESD simulation method to be practiced by the ESD simulation device according to the second preferred embodiment. The flow of FIG. 8 will be described using the MOSFET of FIG. 3 as an example, as in the first preferred embodiment.

In Step S11, the to-be-analyzed region dividing means 12 reads the original computational structure data D11 which defines the circuit structure to be subjected to a conventional three-dimensional device simulation. The original computational structure data D11 defines a device shown in FIG. 9.

Figure 9:
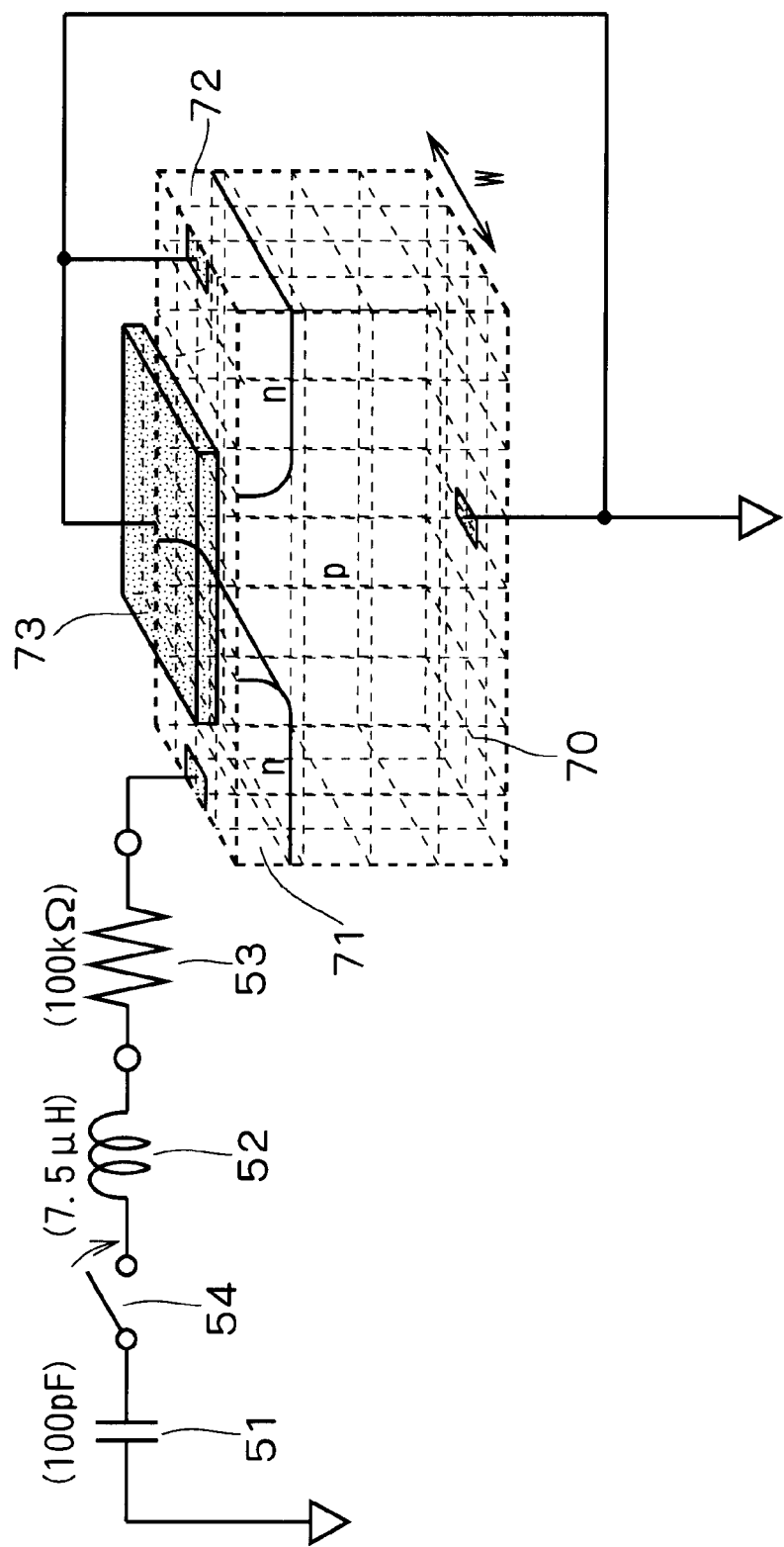
FIG. 9 illustrates a structure defined by original computational structure data according to the second preferred embodiment.

With reference to FIG. 9, a MOSFET having a three-dimensional structure corresponds to the to-be-analyzed region and is divided, as depicted by the broken lines of FIG. 9, into meshes having a three-dimensional structure for device simulation.

Referring again to FIG. 8, in Step S12, the to-be-analyzed region dividing means 12 selects a to-be-analyzed region to be divided from the circuit structure to be simulated which is defined by the original computational structure data D11, based on the input parameters provided from the parameter input means 11. In the circuit example of FIG. 9, the MOSFET having the three-dimensional structure itself corresponds to the to-be-analyzed region.

Figure 10:
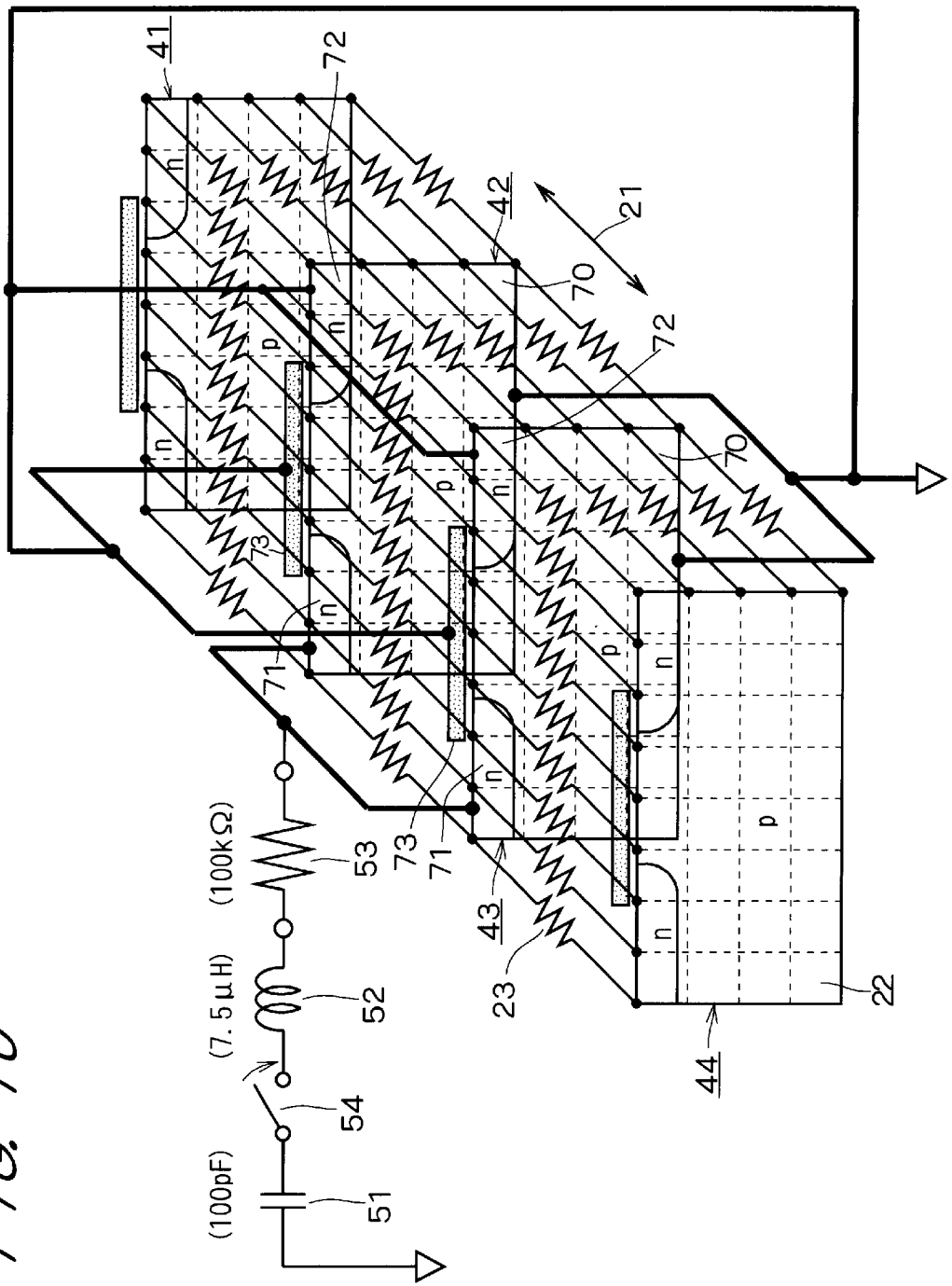
FIG. 10 illustrates a circuit configuration defined by modified computational structure data according to the second preferred embodiment.

In Step S13, the to-be-analyzed region dividing means 12 divides the three-dimensional to-be-analyzed region into a plurality of two-dimensional to-be-analyzed sub-regions, based on the input parameters provided from the parameter input means 11. For instance, the three-dimensional to-be-analyzed region is divided into four two-dimensional to-be-analyzed sub-regions 41 to 44 each lying in a plane perpendicular to the gate width direction 21, as shown in FIG. 10. Each of the to-be-analyzed sub-regions 41 to 44 is divided into a plurality of meshes 22 for two-dimensional device simulation.

In consideration for the relationship between the positions of the to-be-analyzed sub-regions 41 to 44 relative to each other in the gate width direction 21, the drain regions 71 of only the to-be-analyzed sub-regions 42 and 43 regarded as a mid portion of the original structure are connected to one end of the resistor 53. Similarly, electric connections are made between the gate electrodes 73 of only the to-be-analyzed sub-regions 42 and 43 regarded as a mid portion of the original structure, between the source regions 72 thereof and between the substrates 70 thereof.

In Step S13, after dividing the to-be-analyzed region into the plurality of to-be-analyzed sub-regions, the to-be-analyzed region dividing means 12 individually sets characteristic values for device simulation of the respective meshes of each to-be-analyzed sub-region, based on the input parameters provided from the parameter input means 11. Examples of the characteristic values for device simulation include shape, conductivity type and impurity concentration.

In Step S14, for maintenance of circuit structure equivalence with the to-be-analyzed region and consideration of the current flowing in the direction of the gate width, the to-be-analyzed region dividing means 12 establishes connections between the vertices of corresponding meshes of adjacent ones of the plurality of to-be-analyzed sub-regions through mesh connecting resistors, and thereafter outputs the modified computational structure data D12 which defines the circuit structure to be simulated in which the to-be-analyzed region is replaced with the plurality of to-be-analyzed sub-regions to the device simulation means 13.

In the instance shown in FIG. 10, the mesh connecting resistors 23 connect the vertices of the corresponding meshes of adjacent ones of the to-be-analyzed sub-regions 41 to 44.

The mesh connecting resistors, similar to the node connecting resistors of the first preferred embodiment, are provided for consideration of the voltage drop developed when current flows in the direction of the gate width of the device, and improves the precision of computations as an actual physical phenomenon. The value of the mesh connecting resistors may be calculated from the sheet resistance of a corresponding region or approximated to a zero resistance (in which case only the electric connections are made without the mesh connecting resistors).

Figure 11:
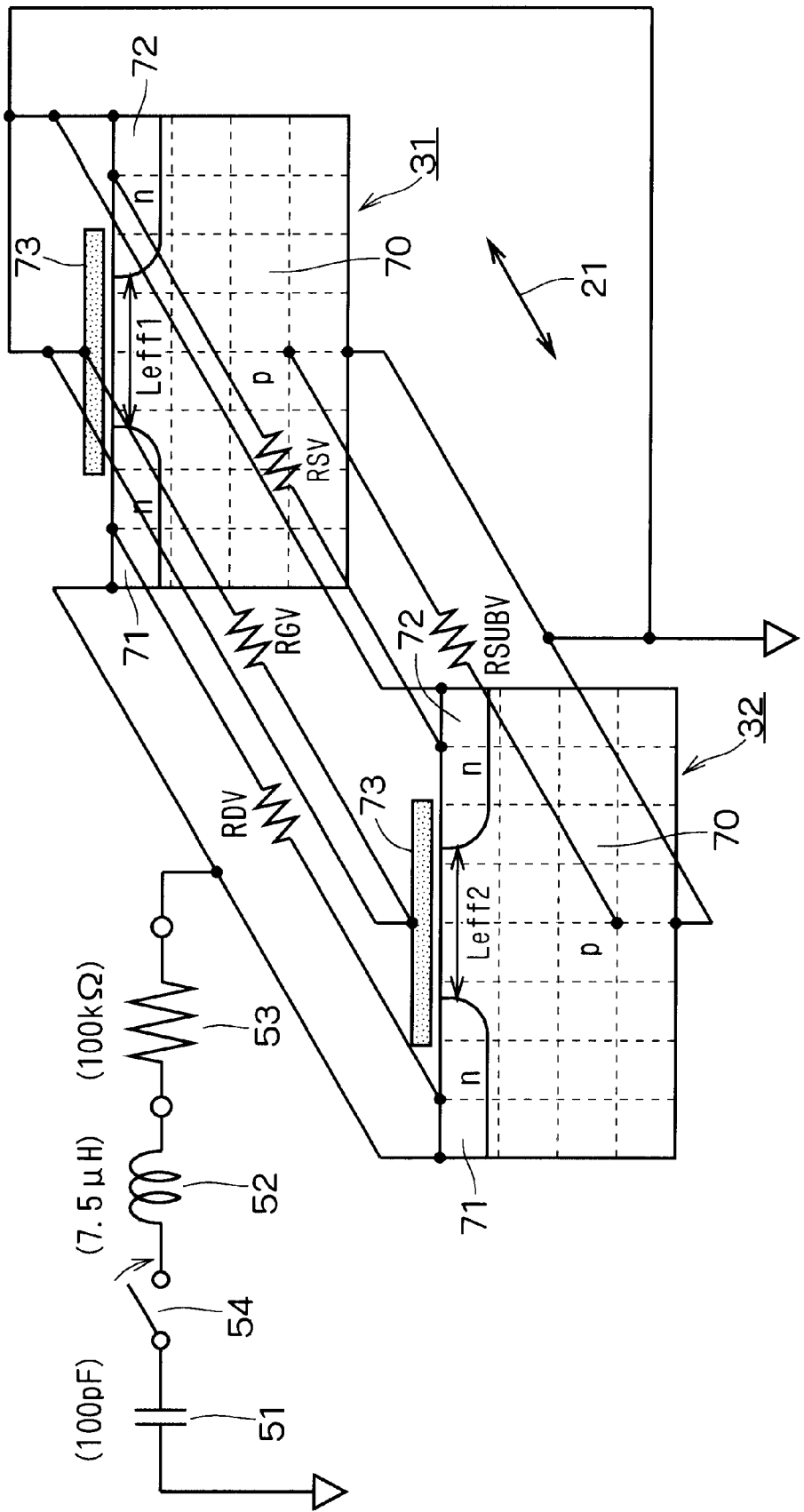
FIG. 11 illustrates consideration for current flowing in the direction of a gate width.

FIG. 11 illustrates the effect of the provision of the mesh connecting resistors (and the node connecting resistors in the first preferred embodiment). For ease of understanding, FIG. 11 shows a minimum required arrangement in which the to-be-analyzed region is divided into two to-be-analyzed sub-regions 31 and 32, with the mesh connecting resistors RDV, RSV, RGV and RSUBV connected between the drain regions of the two to-be-analyzed sub-regions 31 and 32, the source regions thereof, the gate regions thereof and the substrate regions thereof, respectively.

A single transistor can have different channel lengths according to the position thereof because of variations in semiconductor manufacturing process. On the other hand, the arrangement of FIG. 11 is designed such that the to-be-analyzed sub-regions 31 and 32 have individually set channel lengths Leff1 and Leff2, respectively. This allows the simulation of the transistor having different channel lengths according to the position thereof by making variations between the channel lengths Leff1 and Leff2.

If the characteristic values for device simulation of the to-be-analyzed sub-regions 31 and 32 are rendered different from each other to satisfy Leff1<Leff2, the channel resistance of the to-be-analyzed sub-region 31 is lower than that of the to-be-analyzed sub-region 32. Then, more current flows through the to-be-analyzed sub-region 31 than through the to-be-analyzed sub-region 32. Thus, the difference between the to-be-analyzed sub-regions 31 and 32 in amounts of current flowing therethrough develops voltage differences across the connecting resistors RDV, RSV, RGV and RSUBV to cause current to flow.

This current corresponds to the current flowing in the gate width direction 21 and detectable by the three-dimensional device simulation based on the original computational structure data D11. That is, connecting the two-dimensional to-be-analyzed sub-regions through the connecting resistors allows the simulation which takes into consideration the current flow in the gate width direction to be performed on the modified computational structure data D12 containing two-dimensional combined structures.

Referring again to FIG. 8, in Step S15, the device simulation means 13 receives the modified computational structure data D12 and performs the two-dimensional device simulation on the circuit structure defined by the modified computational structure data D12. In Step S16, the device simulation means 13 outputs a device simulation result and terminates the ESD simulation.

Thus, the to-be-analyzed region dividing means 12 of the ESD simulation device according to the second preferred embodiment divides the to-be-analyzed region into the plurality of to-be-analyzed sub-regions arranged in the gate width direction, each of the to-be-analyzed sub-regions being simulatable in two-dimensional device simulation. The to-be-analyzed region dividing means 12 also establishes electric connections between the plurality of to-be-analyzed sub-regions, and outputs the modified computational structure data D12 which defines the circuit structure to be simulated in which the to-be-analyzed region is replaced with the plurality of to-be-analyzed sub-regions.

Therefore, the two-dimensional device simulation which takes into consideration a shape effect in the gate width direction may be performed by providing the different physical characteristic values, respectively, of the plurality of to-be-analyzed sub-regions.

Additionally, the two-dimensional device simulation requires shorter calculation time than the three-dimensional device simulation, to provide the simulation result in a relatively short period of time.

Furthermore, the to-be-analyzed region dividing means 12 of the ESD simulation device according to the second preferred embodiment sets the physical characteristic values of the respective to-be-analyzed sub-regions based on the input parameters provided from the parameter input means 11. Therefore, the physical characteristic values of the respective to-be-analyzed sub-regions may be externally set at desired values by using the parameter input means 11.

<Third Preferred Embodiment>

Figure 12:
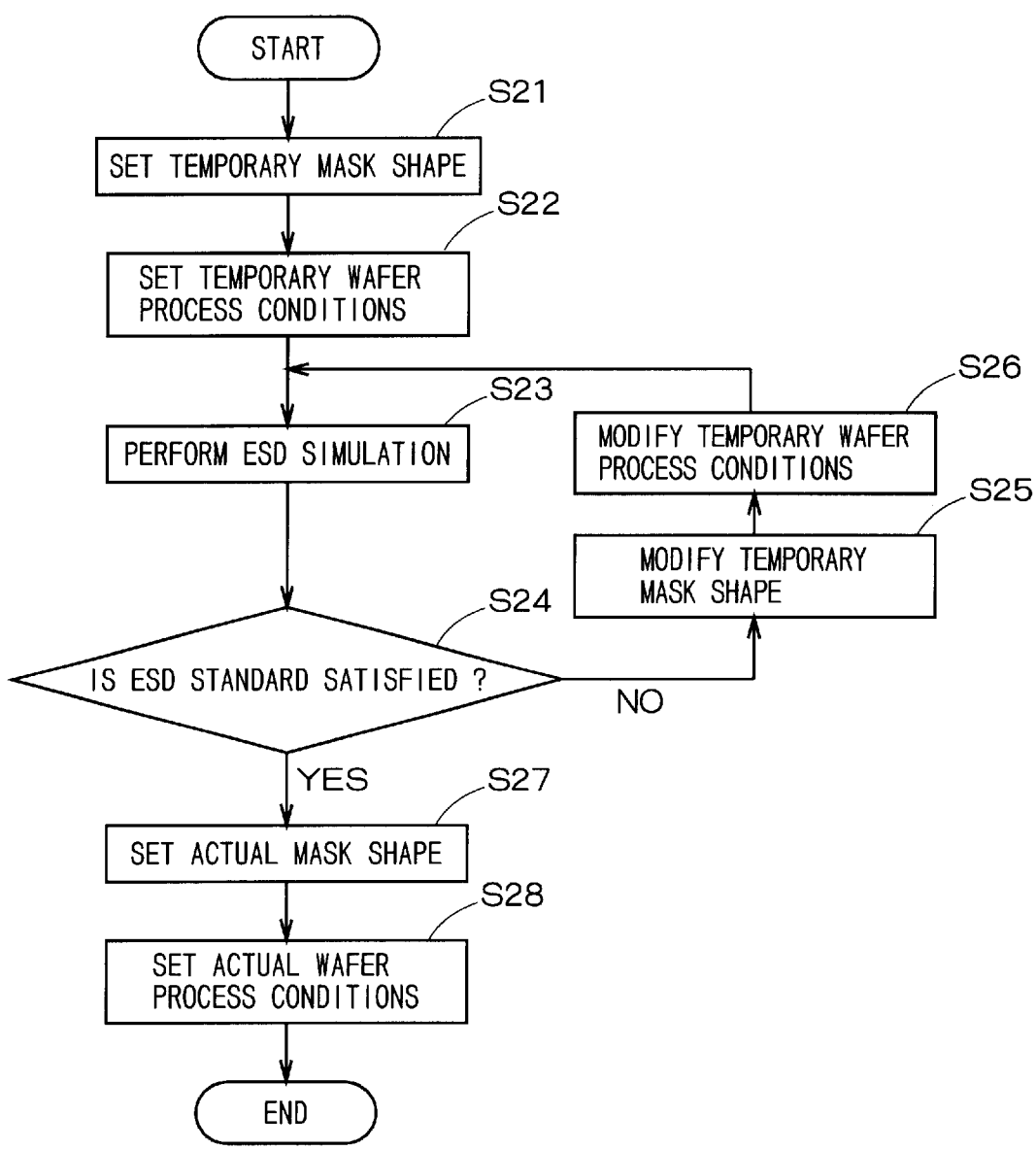
FIG. 12 is a flowchart showing a method of setting manufacturing process conditions according to a third preferred embodiment of the present invention.

FIG. 12 is a flowchart showing a method of setting manufacturing process conditions according to a third preferred embodiment of the present invention. The manufacturing process conditions mean conditions including mask shape and wafer process conditions in a plurality of steps of a predetermined manufacturing process through which a predetermined semiconductor integrated circuit is manufactured. The method of setting the manufacturing process conditions will be discussed with reference to FIG. 12.

Initially, in Step S21, the shape of a temporary mask for patterning for use in the manufacturing process is set. Next, in Step S22, temporary wafer process conditions such as ion implantation energy and diffusion time are set. As a result, temporary manufacturing process conditions including the shape of the temporary mask and the temporary wafer process conditions are determined.

This determines electrical characteristic values of the predetermined semiconductor integrated circuit when manufactured through the predetermined manufacturing process under the temporary manufacturing process conditions.

In Step S23, the ESD simulation described in the first preferred embodiment (circuit simulation) or the second preferred embodiment (two-dimensional device simulation) is performed on the predetermined semiconductor integrated circuit, as the circuit to be simulated, with the electrical characteristic values thereof determined in Steps S21 and S22.

In Step S24, whether or not an ESD standard is satisfied is judged based on the ESD simulation result. An example of the ESD standard is such that a maximum temperature provided as the simulation result is not higher than a predetermined temperature.

When it is judged in Step S24 that the ESD standard is not satisfied (NO), modifications are made to the temporary mask shape in Step S25 and to the temporary wafer process conditions in Step S26, thereby modifying the electrical characteristic values of the predetermined semiconductor integrated circuit. Then, the ESD simulation is performed again in Step S23.

Steps S23 to S26 are repeated until it is judged in Step S24 that the ESD standard is satisfied (YES).

When it is judged in Step S24 that the ESD standard is satisfied (YES), an actual mask shape is set by substituting the temporary mask shape for the actual mask shape in Step S27, and actual wafer process conditions are set by substituting the temporary wafer process conditions for the actual wafer process conditions in Step S28. Conditions including the actual mask shape and the actual wafer process conditions are actual manufacturing process conditions.

The ESD simulation result of the first or second preferred embodiment has already verified that the semiconductor integrated circuit provided through the manufacturing process under the actual manufacturing process conditions satisfies the ESD standard. Therefore, the actual manufacture of the predetermined semiconductor integrated circuit through the manufacturing process under the actual manufacturing process conditions provides the semiconductor integrated circuit which reliably satisfies the ESD standard. Consequently, the semiconductor integrated circuit which satisfies the ESD standard is manufactured at low costs and in a short period of time.

<Fourth Preferred Embodiment (Application to Recording Medium)>

Figure 13:
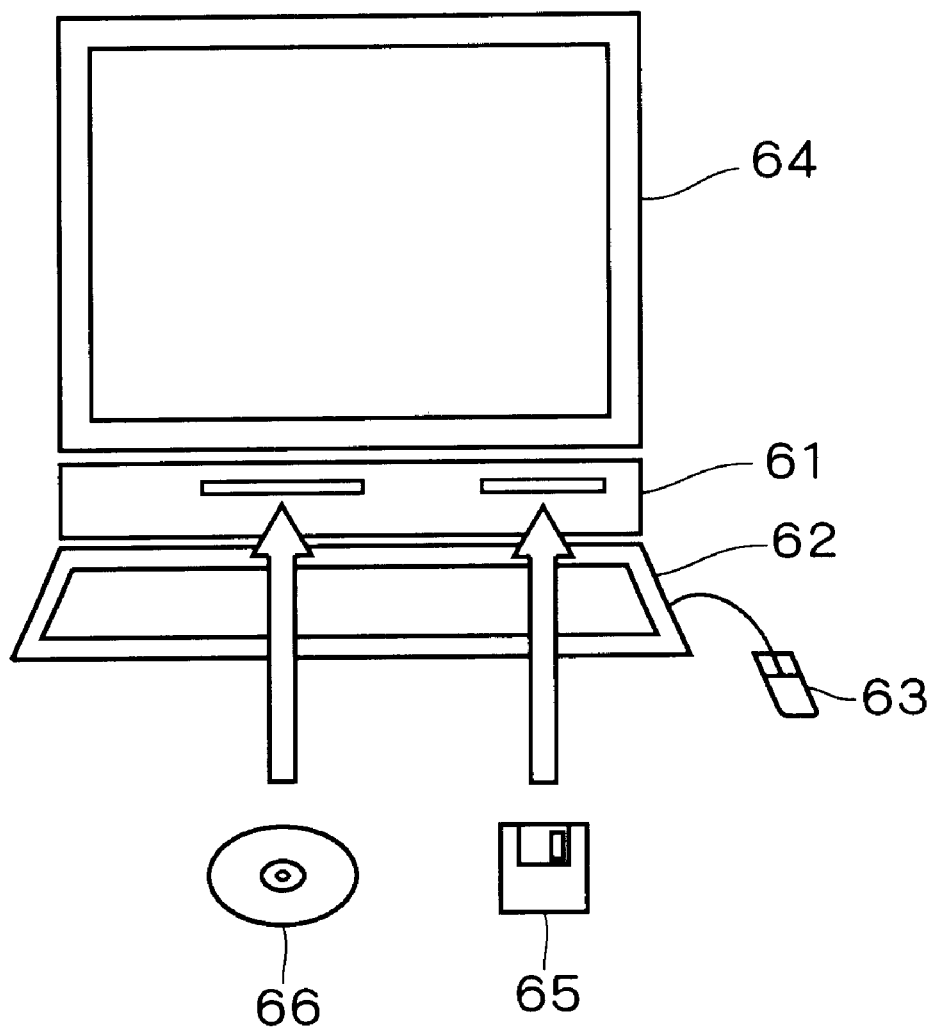
FIG. 13 illustrates an application of the simulation device to a recording medium according to a fourth preferred embodiment of the present invention.

FIG. 13 illustrates a hardware arrangement of the simulation device according to a fourth preferred embodiment of the present invention. The simulation device according to the fourth preferred embodiment features the storing of the ESD simulation (circuit simulation) method of the first preferred embodiment shown in FIG. 2 or the ESD simulation (two-dimensional device simulation) method of the second preferred embodiment shown in FIG. 8 on a recording medium.

With reference to FIG. 13, the ESD simulation device used herein is a computer including a CPU 61, a keyboard 62, a mouse 63 and a display 64, and a simulation execution program containing the description of the ESD simulation method of the first or second preferred embodiment is stored on a flexible disk 65 or in a CD-ROM 66. The components illustrated in FIG. 1 or 7 (the parameter input means 1, the block dividing means 2 and the circuit simulation means 3, or the parameter input means 11, the to-be-analyzed region dividing means 12 and the device simulation means 13) are assigned as functional blocks constituting the simulation execution program.

While the invention has been described in detail, the foregoing description is in all aspects illustrative and not restrictive. It is understood that numerous other modifications and variations can be devised without departing from the scope of the invention.

What is claimed is:

1. A simulation device comprising:

to-be-analyzed block dividing means receiving a netlist defining a circuit to be simulated and for dividing a predetermined to-be-analyzed block specifying a device included in said circuit to be simulated into a plurality of to-be-analyzed sub-blocks arranged in a predetermined direction, with equivalence with said predetermined to-be-analyzed block maintained, to output a modified netlist defining a new circuit to be simulated in which said predetermined to-be-analyzed block is replaced with said plurality of to-be-analyzed sub-blocks; and circuit simulation means for performing a circuit simulation on said new circuit to be simulated which is defined by said modified netlist, wherein said to-be-analyzed block dividing means is capable of individually setting circuit simulation characteristic values, respectively, of said plurality of to-be-analyzed sub-blocks.

2. The simulation device according to claim 1, further comprising parameter input means for inputting an input parameter to said to-be-analyzed block dividing means, said input parameter containing information which determines said circuit simulation characteristic values, respectively, of said plurality of to-be-analyzed sub-blocks, wherein said to-be-analyzed block dividing means individually sets said circuit simulation characteristic values, respectively, of said plurality of to-be-analyzed sub-blocks, based on said input parameter.

3. The simulation device according to claim 2, wherein said input parameter contains information specifying said predetermined to-be-analyzed block and information specifying the number of to-be-analyzed sub-blocks into which said predetermined to-be-analyzed block is divided.

4. The simulation device according to claim 1, wherein said predetermined to-be-analyzed block includes a MOS transistor which takes a resistance element into consideration, and said predetermined direction includes the direction of the gate width of said MOS transistor.

5. The simulation device according to claim 4, wherein said to-be-analyzed block dividing means establishes an electric connection between adjacent ones of said plurality of to-be-analyzed sub-blocks through a connecting resistor.

6. The simulation device according to claim 1, wherein said circuit to be simulated includes a circuit comprising a MOS transistor to which an electrostatic discharge from a human body model is applied.

7. A method of simulation, comprising the steps of:

(a) reading a netlist defining a circuit to be simulated;

(b) selecting a predetermined to-be-analyzed block to be divided which specifies a device out of said circuit to be simulated;

(c) dividing said predetermined to-be-analyzed block into a plurality of to-be-analyzed sub-blocks arranged in a predetermined direction and individually setting circuit simulation characteristic values, respectively, of said plurality of to-be-analyzed sub-blocks;

(d) establishing an electric connection between said plurality of to-be-analyzed sub-blocks so as to maintain equivalence with said predetermined to-be-analyzed block, and thereafter outputting a modified netlist defining a new circuit to be simulated in which said predetermined to-be-analyzed block is replaced with said plurality of to-be-analyzed sub-blocks; and (e) performing a circuit simulation on said new circuit to be simulated which is defined by said modified netlist.

8. A method of setting a process condition using the method of simulation according to claim 7, comprising the steps of:

(a) performing a method of simulation as recited in claim 7 using as the circuit to be simulated a predetermined semiconductor integrated circuit manufactured through a manufacturing process with a temporary manufacturing process condition established therein;

(b) judging whether or not said circuit to be simulated satisfies a predetermined standard, based on a result of the simulation performed in said step (a);

(c) modifying said temporary manufacturing process condition to execute said steps (a) and (b) again when it is judged in said step (b) that said circuit to be simulated does not satisfy said predetermined standard; and (d) setting an actual manufacturing process condition for use in actual manufacture of said predetermined semiconductor integrated circuit by substituting said temporary manufacturing process condition for said actual manufacturing process condition when it is judged in said step (b) that said circuit to be simulated satisfies said predetermined standard.

9. A computer readable recording medium on the method of simulation according to claim 7, said recording medium having stored thereon a program for performing a method of simulation as recited in claim 7.

* * * * *